United States Patent
Haindl et al.

(10) Patent No.: US 11,223,213 B2
(45) Date of Patent: Jan. 11, 2022

(54) BATTERY SYSTEM AND ELECTRIC VEHICLE USING THE SAME

(71) Applicant: SAMSUNG SDI CO., LTD., Yongin-si (KR)

(72) Inventors: Michael Haindl, Hartberg (AT); Jürgen Fritz, Graz (AT)

(73) Assignee: Samsung SDI Co., Ltd., Gyeonggi-do (KR)

( * ) Notice: Subject to any disclaimer, the term of this patent is extended or adjusted under 35 U.S.C. 154(b) by 149 days.

(21) Appl. No.: 16/564,661

(22) Filed: Sep. 9, 2019

(65) Prior Publication Data
US 2020/0127469 A1 Apr. 23, 2020

(30) Foreign Application Priority Data

Oct. 18, 2018 (EP) ........................................ 8201237
Mar. 12, 2019 (KR) ........................ 10-2019-0028231

(51) Int. Cl.
*H02J 7/00* (2006.01)
*G01R 31/367* (2019.01)
*G01R 31/3842* (2019.01)
*H01M 10/48* (2006.01)

(52) U.S. Cl.
CPC .......... *H02J 7/0019* (2013.01); *G01R 31/367* (2019.01); *G01R 31/3842* (2019.01); *H01M 10/482* (2013.01)

(58) Field of Classification Search
CPC ........ H02J 7/0019; H02J 7/00; G01R 31/367; G01R 31/3842; H01M 10/482
See application file for complete search history.

(56) References Cited

U.S. PATENT DOCUMENTS

| | | | |
|---|---|---|---|
| 2007/0116997 A1* | 5/2007 | Raiser | H01M 8/04865 429/431 |
| 2008/0224687 A1 | 9/2008 | Breese et al. | |
| 2013/0314097 A1 | 11/2013 | Hausberger et al. | |

(Continued)

FOREIGN PATENT DOCUMENTS

| CN | WO 2015/078049 A1 * | 6/2015 | ............... B60L 3/04 |
|---|---|---|---|
| JP | 2015-204657 A | 11/2015 | |

(Continued)

OTHER PUBLICATIONS

ISO 6469-4, "Electrically propelled road vehicles—Safety specifications—Part 4: Post-crash electrical safety," First edition, (Sep. 1, 2015) pp. 1-15.

(Continued)

*Primary Examiner* — Vuthe Siek
(74) *Attorney, Agent, or Firm* — Knobbe, Martens, Olson & Bear, LLP

(57) ABSTRACT

A battery module for use with an electric vehicle is disclosed. In one aspect, the battery module includes a power source and an isolation monitoring circuit electrically connected with the power source. The electric vehicle includes a Y-capacitor module. The isolation monitoring circuit can discharge the Y-capacitor module when the battery module is electrically connected with the electric vehicle. According to at least one of the disclosed embodiments, no additional HV efforts to discharge a Y-capacitor, and discharge of a vehicle Y-capacitor can be performed on the battery side.

17 Claims, 4 Drawing Sheets

(56) References Cited

U.S. PATENT DOCUMENTS

| | | |
|---|---|---|
| 2014/0049103 A1 | 2/2014 | Fink |
| 2014/0154537 A1 | 6/2014 | Dämon et al. |
| 2015/0051771 A1* | 2/2015 | Greenwood ............ B60L 3/04 |
| | | 701/22 |
| 2016/0107525 A1 | 4/2016 | Min et al. |
| 2016/0202301 A1 | 7/2016 | Mizoguchi et al. |
| 2017/0137023 A1* | 5/2017 | Anderson ............ B60W 50/14 |
| 2017/0160333 A1 | 6/2017 | Kawanaka et al. |

FOREIGN PATENT DOCUMENTS

| | | |
|---|---|---|
| JP | 2016-039641 A | 3/2016 |
| KR | 20-1995-0009541 Y1 | 11/1995 |

OTHER PUBLICATIONS

ISO 6469-3, "Electrically propelled road vehicles—Safety specifications—Part 3: Electrical safety," Third edition, (Oct. 2018) pp. 1-20.

Extended European Search Report dated Jan. 2, 2019 for European Patent Application No. EP 18 201 237.7 from which subject U.S. Appl. No. 16/564,661 claims priority.

* cited by examiner

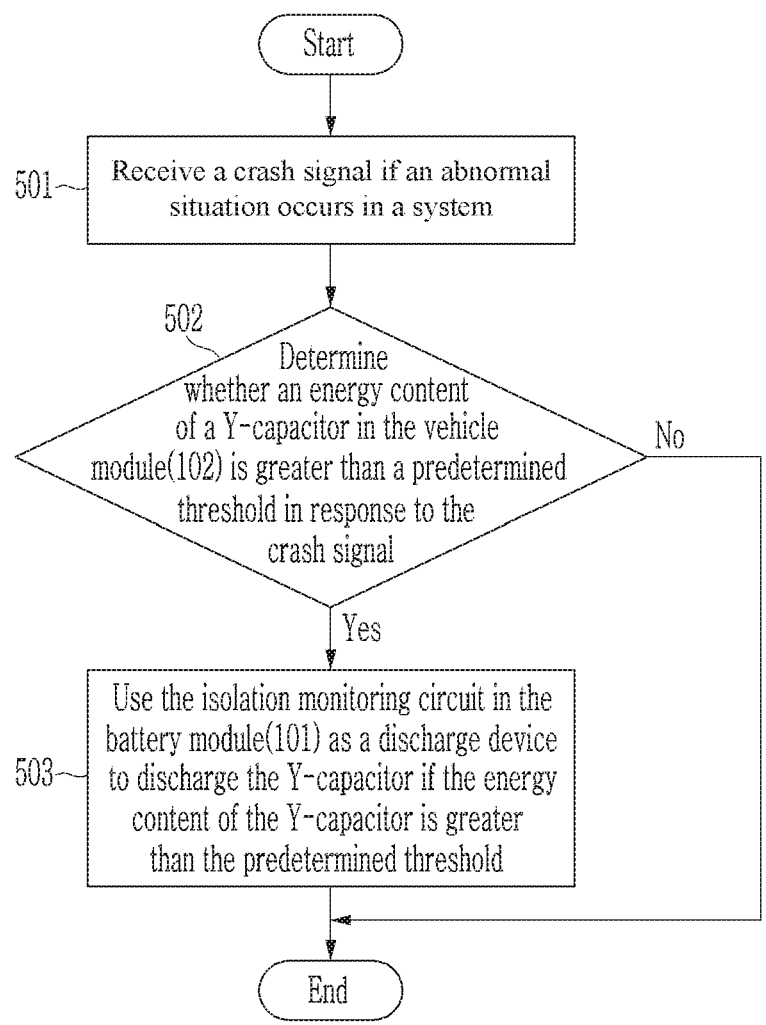

BATTERY SYSTEM AND ELECTRIC VEHICLE USING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The described technology generally relates to a battery system and an electric vehicle using the battery system.

Description of the Related Technology

Recently, vehicles for transportation of goods and people have been developed using an electric power source. Such an electric vehicle is propelled by an electric motor, using energy stored in rechargeable batteries. An electric vehicle may be solely powered by batteries or may be a hybrid vehicle including a combination of an electric motor and a conventional internal combustion engine.

In general, an electric-vehicle battery (EVB) or traction battery is used to power the propulsion of battery electric vehicles (BEVs). Electric-vehicle batteries differ from starting, lighting, and ignition batteries because they are designed to give power over sustained periods of time. A rechargeable or secondary battery differs from a primary battery in that it can be repeatedly charged and discharged, while the latter provides only an irreversible conversion of chemical to electrical energy. Low-capacity rechargeable batteries are used as a power supply for small electronic devices, such as smartphones, laptops and camcorders, while high-capacity rechargeable batteries are used as the power supply for hybrid vehicles and the like.

In general, rechargeable batteries include an electrode assembly including a positive electrode, a negative electrode, and a separator interposed between the positive and negative electrodes, a case receiving the electrode assembly, and an electrode terminal electrically connected to the electrode assembly. An electrolyte solution is injected into the case in order to enable charging and discharging of the battery via an electrochemical reaction of the positive electrode, the negative electrode, and the electrolyte solution. The shape of the case, e.g., cylindrical or rectangular, depends on the battery's intended purpose. Lithium-ion (and similar lithium polymer) batteries, widely known via their use in laptops and consumer electronics, dominate the most recent group of electric vehicles in development.

Rechargeable batteries may be used as a battery module formed of a plurality of unit battery cells coupled in series and/or in parallel so as to provide a high energy density, in particular for motor driving of a hybrid vehicle. That is, the battery module is formed by interconnecting the electrode terminals of the plurality of unit battery cells depending on a required amount of power and in order to realize a high-power rechargeable battery.

A battery pack is a set of any number of (e.g., identical) battery modules. They may be configured in a series, parallel or a mixture of both to deliver the desired voltage, capacity, or power density. Components of battery packs include the individual battery modules, and the interconnects, which provide electrical conductivity between them.

For meeting the dynamic power demands of various electrical consumers connected to the battery system a static control of battery power output and charging is not sufficient. Thus, steady exchange of information between the battery system and the controllers of the electrical consumers is required. This information includes the battery systems actual state of charge (SoC), potential electrical performance, charging ability and internal resistance as well as actual or predicted power demands or surpluses of the consumers.

SUMMARY OF CERTAIN INVENTIVE EMBODIMENTS

One inventive aspect provides a solution for actively discharging a Y-capacitor in a battery system via an isolation monitoring circuit of the battery system.

Another aspect is a battery module that can be coupled with a vehicle module. The battery module comprises a power source and an isolation monitoring circuit coupled with the power source. The isolation monitoring circuit is configured to be able to discharge a Y-capacitor module when the battery module is coupled with the vehicle module.

According to at least one of the disclosed embodiments, no additional HV efforts to discharge a Y-capacitor, and discharge of a vehicle Y-capacitor can be performed on the battery side. In particular, discharging the Y-capacitor of the HV-System can be implemented by using the isolation monitoring circuit of a battery system. Already present components of the battery system can be used for discharging the Y-capacitor between a HV pole of the battery system and a chassis of the system/vehicle. For discharging the Y-capacitor, at least one HV pole is connected to a chassis via part of the isolation monitoring circuit integrated in the battery system. The isolation monitoring circuit comprises a discharge path between each HV pole and the chassis, each comprising a discharge switch and a resistor. In an abnormal operation condition, if HV poles are separated from a cell stack via disconnect relays, at least one disconnect relay and the corresponding discharge switch are set conductive and the Y-capacitor is discharged via the resistor.

At least one of the disclosed embodiments uses already available actuators and components of a HV battery system and enables the battery to actively discharge Y capacitors of the HV board net. Costs for this functionality can be saved on other components. Additionally, this functionality can be sold as "unique selling point" USP of the HV battery.

Another aspect is a system comprising a battery module that can be coupled with a vehicle module comprising a Y-capacitor module that includes one or more Y-capacitors.

Another aspect is a method comprising:
receiving a crash signal if an abnormal situation occurs in a system as defined above;
determining whether an energy content of a Y-capacitor in the vehicle module is greater than a predetermined threshold in response to the crash signal;
using the isolation monitoring circuit in the battery module as a discharge device to discharge the Y-capacitor if the energy content of the Y-capacitor is greater than the predetermined threshold.

Another aspect is a battery system for use with an electric vehicle including a Y-capacitor module, the battery module comprising: a power source; and an isolation monitoring circuit electrically connected with the power source, wherein the isolation monitoring circuit is configured to discharge the Y-capacitor module when the battery module is electrically connected with the electric vehicle.

In the above battery system, the isolation monitoring circuit is configured to be connected in parallel with the Y-capacitor module when the battery module is electrically connected with the electric vehicle. In the above battery system, the isolation monitoring circuit comprises one or more circuit units each of which corresponds to a Y-capacitor of the Y-capacitor module comprising one or more Y-capacitors. In the above battery system, each of the one or more circuit units comprises a switch and a resistor connected in series with each other, and wherein the resistor is configured to discharge the Y-capacitor within a required time. In the above battery system, each of the one or more circuit units further comprises a main relay connected in series with the switch and the resistor configured to separate the power source from the electric vehicle.

In the above battery system, the power source includes a positive terminal and a negative terminal, wherein the Y-capacitor module comprises two Y-capacitors, wherein first and second circuit units corresponding to the two Y-capacitors are arranged in the isolation monitoring circuit, wherein the first circuit unit comprises a first resistor and a first switch connected between the positive terminal of the power source and a chassis, wherein the second circuit unit comprises a second resistor and a second switch connected between the negative terminal of the power source and the chassis, and wherein the first and second circuit units are configured to be connected in parallel with a first Y-capacitor and a second Y-capacitor of the Y-capacitor module respectively so as to discharge the first Y-capacitor and the second Y-capacitor respectively.

In the above battery system, the first circuit unit further comprises a first main relay (Main+) connected in series with the first resistor and the first switch, wherein the second circuit unit further comprises a second main relay (Main−) connected in series with the second resistor and the second switch, and wherein the power source is connected between the first main relay (Main+) and the second main relay (Main−).

Another aspect is a system comprising a battery module configured to be coupled with a vehicle module, wherein the vehicle module comprises a Y-capacitor module comprising one or more Y-capacitors, wherein the battery module comprises a power source and an isolation monitoring circuit electrically connected with the power source, and wherein the isolation monitoring circuit is configured to discharge the Y-capacitor module when the battery module is electrically connected with the vehicle module.

In the above system, the vehicle module further comprises a load, and wherein the Y-capacitor module and the load are connected in parallel between a first HV pole (HV+) and a second HV pole (HV−) of the vehicle module. In the above system, the isolation monitoring circuit is configured to be connected in parallel with the Y-capacitor module when the battery module is electrically connected with the vehicle module. In the above system, the Y-capacitor module comprises first and second Y-capacitors arranged between the first and second HV poles (HV+ and HV−) of the vehicle module, wherein the first Y-capacitor is arranged between the first HV pole (HV+) and a chassis, and wherein the second Y-capacitor is arranged between the second HV pole (HV−) and the chassis.

In the above system, the vehicle module further comprises an X-capacitor and a load connected between the first and second HV poles (HV+ and HV−), and a discharge circuit unit connected in parallel with and configured to discharge the X-capacitor, and wherein the X-capacitor comprises a switch and a resistor connected in series with each other. In the above system, the chassis is either of the vehicle module or the battery module, or both of the vehicle module and the battery module.

Another aspect is a method, comprising: receiving a crash signal in response to an abnormal situation occurring in a system including a battery module and a vehicle module connected to each other, the battery module including an isolation monitoring circuit electrically connected with a power source, the vehicle module including an Y-capacitor; determining whether an energy content of the Y-capacitor of the vehicle module is greater than a predetermined threshold in response to the crash signal; and using the isolation monitoring circuit of the battery module as a discharge device to discharge the Y-capacitor of the vehicle module in response to the energy content of the Y-capacitor being greater than the predetermined threshold.

In the above method, the threshold is 0.2 J, and the using comprises controlling a relay between the battery module and the vehicle module to connect the isolation monitoring circuit with the Y-capacitor, wherein in response to the Y-capacitor being discharged, both the corresponding switch and the corresponding main relay are configured to be closed, and wherein in response to the Y-capacitor not being discharged, at least one of the corresponding switch and the corresponding main relay is configured to be opened.

Another aspect is an electric vehicle configured to be electrically connected with a battery module, the electric vehicle comprising: a load; a Y-capacitor module electrically connected to the load; and a processor circuit configured to detect an abnormal situation in the electric vehicle, determine whether an energy content of the Y-capacitor module is greater than a predetermined threshold in response to the abnormal situation and discharge the Y-capacitor module using an isolation monitoring circuit of the battery module in response to the energy content of the Y-capacitor module being greater than the predetermined threshold.

In the above electric vehicle, the Y-capacitor module is configured to be connected in parallel with the isolation monitoring circuit when the battery module is electrically connected with the electric vehicle. The above electric vehicle further comprises a first HV pole (HV+) and a second HO pole (HV−), wherein the Y-capacitor module comprises first and second Y-capacitors arranged between the first and second HV poles (HV+, HV−), wherein the first Y-capacitor is arranged between the first HV pole (HV+) and a chassis, and wherein the second Y-capacitor is arranged between the second HV pole (HV−) and the chassis. The above electric vehicle further comprises an X-capacitor and a discharge circuit connected in parallel with and configured to discharge the X-capacitor, wherein the X-capacitor comprises a switch and a resistor connected in series with each other.

BRIEF DESCRIPTION OF THE DRAWINGS

Features will become apparent to those of ordinary skill in the art by describing in detail exemplary embodiments with reference to the attached drawings.

FIG. 4 is a flowchart for a method according to an embodiment of the described technology.

DETAILED DESCRIPTION OF CERTAIN INVENTIVE EMBODIMENTS

Figure 1:
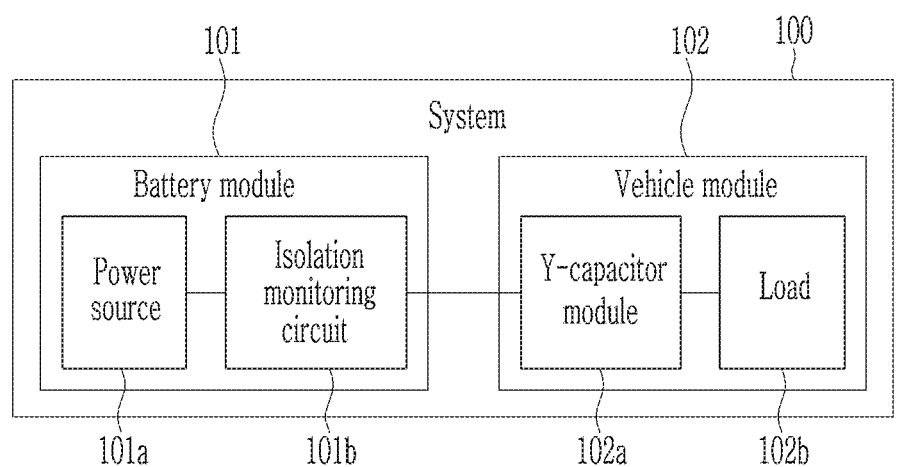
FIG. 1 shows a block diagram of a system comprising a battery module and a vehicle module according to an embodiment of the described technology.

Typical and maximum values for the charge/voltage of a Y capacitor (which is often also denoted as a "Y-Cap") required for a complete high-voltage (HV), board net are usually evaluated during the development phase. Based on the evaluation/values required, it is decided if an active discharge of the Y-capacitor is required or not. The Y-capacitor is usually monitored during operation of the battery system but has to be discharged if the battery system is shut down in an abnormal operation condition. In case, e.g., of a crash, at a vehicle side, a Y-capacitor with an energy content greater than a predetermined threshold, e.g., 0.2 J, needs to be discharged in a certain predetermined time. This is normally performed by an additional independent component connected to the HV board net of the vehicle, except for the HV battery. For instance, an insulation resistance may be additionally arranged between the HV poles and the chassis for discharging a Y-capacitor in case of a crash, which represents a so-called passive discharge solution. As a so-called active discharge solution, a resistor and a switch connected in series may come to use. Normally, the size of the insulation resistance should be large enough, wherein a couple of hundred kOhm, e.g., 100 kOhm, 200 kOhm, 300 kOhm, 400 kOhm, 500 kOhm or 600 kOhm would typically bring the total isolation resistance below <500 kOhm/V. However, the size of the insulation resistance further depends on the operation voltage. In some embodiments, the size of the insulation resistance should ensure at least 500Ω/V of the operation voltage of the battery system. An implementation of the aforementioned discharge causes additional efforts and costs on vehicle side (HV component).

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant descriptions are omitted. As used herein, the term "and/or" includes any and all combinations of one or more of the associated listed items. Further, the use of "may" when describing embodiments of the described technology refers to "one or more embodiments of the described technology."

It will be understood that although the terms "first" and "second" are used to describe various elements, these elements should not be limited by these terms. These terms are only used to distinguish one element from another element. For example, a first element may be named a second element and, similarly, a second element may be named a first element, without departing from the scope of the described technology.

In the following description of embodiments of the described technology, the terms of a singular form may include plural forms unless the context clearly indicates otherwise.

It will be further understood that the terms "include," "comprise," "including," or "comprising" specify a property, a region, a fixed number, a step, a process, an element, a component, and a combination thereof but do not exclude other properties, regions, fixed numbers, steps, processes, elements, components, and combinations thereof.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The described technology, however, may be embodied in various different forms, and should not be construed as being limited to only the illustrated embodiments herein. Rather, these embodiments are provided as examples so that this disclosure will be thorough and complete, and will fully convey the aspects and features of the described technology to those skilled in the art. Accordingly, processes, elements, and techniques that are not necessary to those having ordinary skill in the art for a complete understanding of the aspects and features of the described technology may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the described technology. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value. Further, the use of "may" when describing embodiments of the described technology refers to "one or more embodiments of the described technology." Herein, the terms "upper" and "lower" are defined according to the z-axis. For example, the cover is positioned at the upper part of the z-axis, whereas the ground plate is positioned at the lower part thereof.

The electronic or electric devices and/or any other relevant devices or components according to embodiments of the described technology described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the described technology.

Unless otherwise defined, all terms (including technical and scientific terms) used herein have the same meaning as commonly understood by one of ordinary skill in the art to which the described technology belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 shows a block diagram of a system 100 comprising a battery module 101 (hereinafter to be interchangeably used with a battery system) and a vehicle module 102 (hereinafter to be interchangeably used with an electric vehicle) according to an embodiment of the described technology. FIG. 1 shows only some components of the system 100, the battery module 101 and the vehicle module 102, but various types of components may be additionally provided. Furthermore, certain elements can be removed, two or more elements combined or one element can be separated into multiple elements depending on the specification and requirements.

Referring to FIG. 1, the system 100 comprises the battery module 101 and the vehicle module 102 that may be coupled with the battery module 101. The battery module 101 may comprise, among others, a power source 101a and an isolation monitoring circuit 101b coupled with the power source. The vehicle module 102 may comprise, among others, an Y-capacitor module 102a comprising one or more Y-capacitors, and optionally a load 102b that may be coupled with the Y-capacitor module. The Y-capacitor module and the load may be connected in parallel between HV poles HV+ and HV− of the vehicle module 102. In some embodiments, each Y-capacitor may be a parasitic and/or discrete capacitor between HV− life parts and chassis/LV-Ground.

Further, the HV poles HV+ and HV− may be connected to the load on the vehicle side.

The isolation monitoring circuit of the battery module 101 may be coupled with the Y-capacitor module so that discharge of the Y-capacitor module can be performed on battery side by using the isolation monitoring circuit of the battery module 101. In some embodiments, for each of the one or more Y-capacitors of the Y-capacitor module, a corresponding circuit unit can be arranged in the isolation monitoring circuit, which may comprises at least a switch and a resistor connected in series with each other. In some embodiments, the circuit unit corresponding to a Y-capacitor may further include a main contactor/relay connected in series with the switch and the resistor that may galvanically separate the cells from corresponding HV pole.

Figure 2:
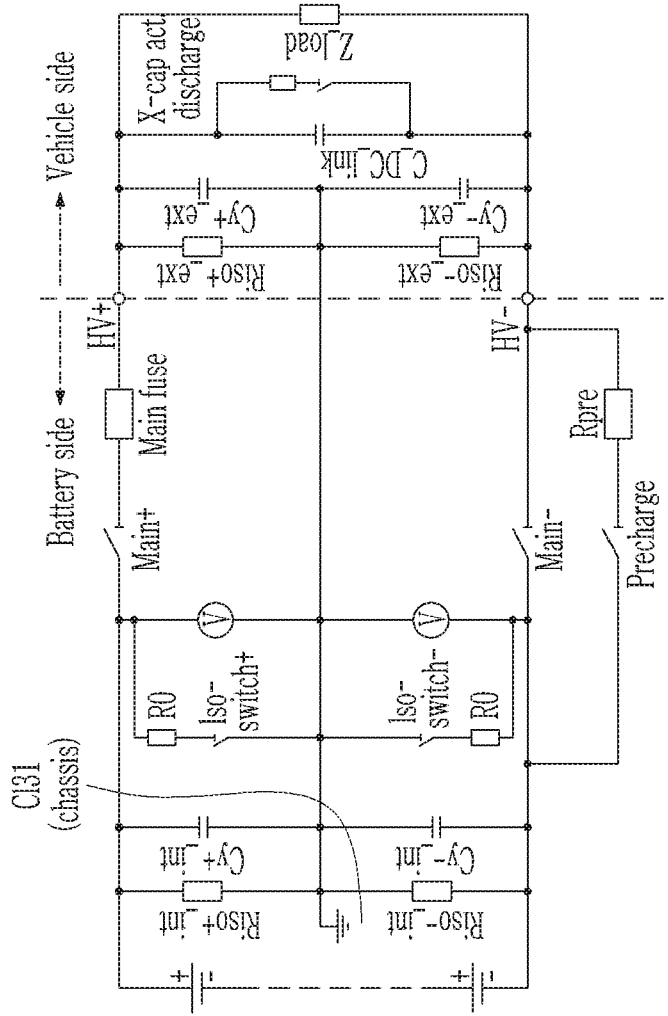
FIG. 2 shows a circuit for implementing the block diagram of the system comprising the battery module and the vehicle module according to FIG. 1.

FIG. 2 shows a circuit for implementing the block diagram of the system comprising a battery module and a vehicle module according to FIG. 1.

Referring to FIG. 2, in the vehicle module 102, two Y-capacitors are arranged between the HV poles HV+ and HV− of the vehicle module 102. A first Y-capacitor of the two Y-capacitors is arranged between a first HV pole HV+ and the chassis/LV-Ground, and a second Y-capacitor of the two Y-capacitors is arranged between a second HV pole HV− and the chassis/LV-Ground. The vehicle module 102 may further include two resistors connected in parallel with the first and second Y-capacitors respectively. The vehicle module 102 may further include an X-capacitor and a load connected between the HV poles HV+ and HV−. A discharge circuit unit for discharging the X-capacitor may be connected in parallel with the X-capacitor, which may comprise a switch and a resistor connected in series with each other. The chassis is either of the vehicle module 102 or the battery module 101, or both of the vehicle module 102 and the battery module 101 are connected. In some embodiments, when in abnormal situations, a Y-capacitor and/or an X-capacitor has an energy content exceeding a predefined threshold, e.g., 0.2 J, a discharging operation is needed.

In the battery module 101, two circuit units corresponding to the two Y-capacitors may be arranged in the isolation monitoring circuit. A first circuit unit of the two circuit units may comprise a first resistor and a first switch connected between the positive terminal of the power source and the chassis. The first circuit unit may further comprise a first main relay Main+ connected in series with the first resistor and the first switch. The first circuit unit may be connected in parallel with the first Y-capacitor so as to discharge the first Y-capacitor. A second circuit unit of the two circuit units may comprise a second resistor and a second switch connected between the negative terminal of the power source and the chassis. The second circuit unit may further comprise a second main relay Main− connected in series with the second resistor and the second switch. The second circuit unit may be connected in parallel with the second Y-capacitor so as to discharge the second Y-capacitor. The main relays Main+ and Main− may be configured to be opened in abnormal situations, e.g., in response to a crash signal. In some embodiments, a main fuse may be arranged between the first HV pole HV+ and the first main relay Main+.

The value of the resistor R0 may be designed to measure the isolation value with an appropriate accuracy and to keep the current between HV− life parts and GND/chassis below a predetermined value, e.g., 2 mA. The value of the resistor R0 may be high enough to discharge the Y-capacitor within a required time. The value of R0 may be in the same magnitude as the insulation resistance normally used between the HV poles and the chassis for discharging the Y-capacitor, e.g., several hundred kΩ. The value of R0 further depends on the operation voltage. In some embodiments, the value of Ro should ensure at least 500Ω/V of the operation voltage of the battery system.

A calculation example of R0 is shown below:

System Voltage: $U_{sys} := 450$ V resistor R0: $R_0 := \dfrac{U_{sys}}{1 \text{ mA}} = 450 k\Omega$ implemented resistor R0: $R_0 := 500$ kΩ
Energy in Y-Cap: $E_{y\_cap} := 0.2$ J Rough value for Y-Cap based on Energy: $C_y := \dfrac{2 \cdot E_{y_{cap}}}{U_{sys}^2} = 1.975 \cdot \mu F$ Selected value for rough calculation: $C_y := 4$ μF
max. time for discharge voltage across Y-caps to below 60V: $t_{max} := 5$ S
voltage after 5 sec. based on values from above:

$$U(t) := U_{sys} \cdot e^{\left(\dfrac{-t}{R_0 \cdot C_y}\right)}$$

U $(t_{max})$=36.938V→lower than 60V, as required.

In the battery module 101, a power source may be connected between the first main relay Main+ and the second main relay Main−, for powering the vehicle module 102 though the first main relay Main+ and the second main relay Main−. When the battery module 101 is coupled with the vehicle module 102 and both of the first main relay Main+ and the second main relay Main− are conductive (or closed), the positive terminal of the power source is connected with HV+ and the negative terminal of the power source is connected with HV−, and the vehicle module 102 is powered on. When the battery module 101 is not coupled with the vehicle module 102 or either of the first main relay Main+ and the second main relay Main− is opened, the vehicle module 102 is powered off. Further, two capacitors connected in series and two resistors connected in series can be connected in parallel between the positive terminal of the power source and the negative terminal of the power source, with the first one of the two capacitors and the first one of the two resistors being connected in parallel between the positive terminal of the power source and the chassis, and the second one of the two capacitors and the second one of the two resistors being connected in parallel between the negative terminal of the power source and the chassis.

Referring to FIG. 2, the main relays Main+ and Main− may galvanically separate the cells from the HV poles HV+, HV−. A precharge circuit unit may be arranged to be connected in parallel with the second main relay Main−.

If the active discharge is requested by the vehicle (e.g., via a crash signal), the X-capacitor may be discharged by other components. Regarding the discharge of the Y-capacitors, the battery module 101 may keep one of the relays Main+ and Main− closed (or closes the same if not already closed) and closes an isolation switch Iso-switch+ or Iso-switch− that is connected to the closed relay.

Thus, the external Y-capacitors are discharged by the corresponding main relay Main+ or Main−, the corresponding resistor R0 and the corresponding isolation switch Iso-switch+ or Iso-switch−. The isolation switch connected to the corresponding relay that is open, may also be kept open. Hence, some embodiments allow to discharge both Y-capacitors by closing a chosen isolation switch and the corresponding main relay.

The external active discharge network as shown in FIG. 2 may be used to discharge the X-capacitor.

Hence, expressed in other words, in a case in which the Y capacitors need to be discharge due to e.g., a crash, the battery keeps one of the relays closed (or closes them if not already closed) and closes the isolation switch that is connected to the closed relay.

Figure 3:
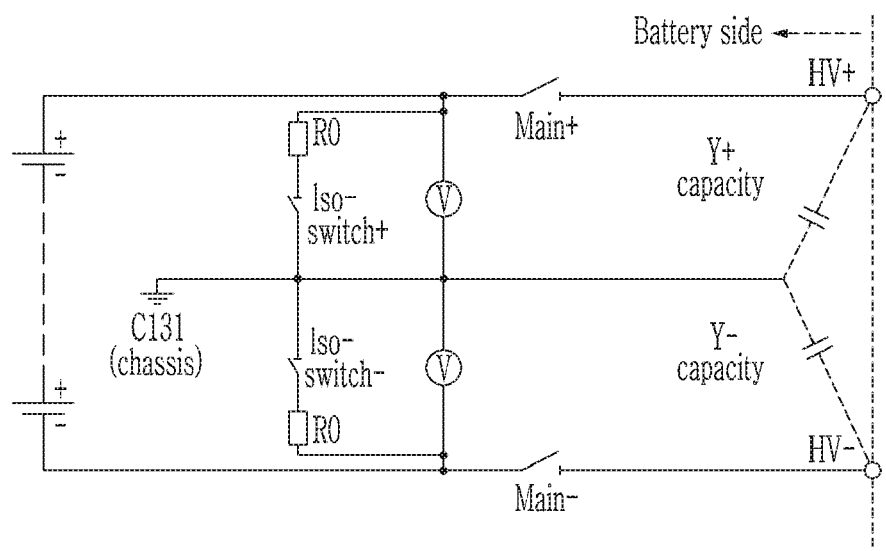
FIG. 3 is a circuit for the battery module according to an embodiment of the described technology.

FIG. 3 is a circuit for the battery module according to an embodiment of the described technology.

Referring to FIG. 3, in the battery module 101, an isolation monitoring circuit and a power source may be arranged. Two circuit units corresponding to the two Y-capacitors may be arranged in the isolation monitoring circuit. A first circuit unit of two circuit units may comprise a first resistor and a first switch connected between the positive terminal of the power source and the chassis. The first circuit unit may further comprise a first main relay Main+ connected in series with the first resistor and the first switch. The first circuit unit may be connected in parallel with the first Y-capacitor so as to discharge the first Y-capacitor. A second circuit unit of two circuit units may comprise a second resistor and a second switch connected between the negative terminal of the power source and the chassis. The second circuit unit may further comprise a second main relay Main− connected in series with the second resistor and the second switch. The second circuit unit may be connected in parallel with the second Y-capacitor so as to discharge the second Y-capacitor. The main relays Main+ and Main− may be configured to be opened in abnormal situations, e.g., in response to a crash signal.

The isolation monitoring circuit may be connected between the HV poles HV+ and HV− when the battery module 101 is coupled with the vehicle module 102. The first circuit unit may be connected in parallel with the first Y-capacitor so as to discharge the first Y-capacitor. The second circuit unit may be connected in parallel with the second Y-capacitor so as to discharge the second Y-capacitor.

FIG. 4 is a flowchart for a method 500 according to an embodiment of the described technology. Although the flowchart of FIG. 4 is described herein with reference to a particular order, in various embodiments, states herein can be performed in a different order, or omitted, and additional states can be added.

The main relays Main+ and Main− may be configured to be opened in abnormal situations, e.g., in response to a crash signal. As a first step of the discharge process, a state of the main relays may be determined. In some embodiments, if one of the main relays is still conductive (e.g., due to a relay fault), the corresponding iso switch is set conductive (or closed) for the discharge of the Y-capacity. If both of the main relays are opened, both the main relay and the corresponding iso switch are set conductive (or closed) for the discharge of the Y-capacity.

The method 500 may comprise the following steps.

In step 501, a crash signal is received if an abnormal situation occurs in a system comprising a battery module 101 and a vehicle module 102. The system can be the one as shown in any of FIGS. 1 and 2, and the battery module 101 can be the one as shown in any of FIGS. 1 to 3.

Optionally, in step 502, it is determined whether an energy content of a Y-capacitor in the vehicle module 102 is greater than a predetermined threshold in response to the crash signal. If the energy content of a Y-capacitor is greater than the predetermined threshold, the method proceeds to step 503, or if not, the method ends. In some embodiments, the threshold may be 0.2 J. Alternatively, if it is set by default that active discharge is triggered, then the method proceeds to step 503 directly after step 501.

In step 503, the isolation monitoring circuit in the battery module 101 is used as a discharge device to discharge the Y-capacitor, by e.g., controlling a relay between the battery module 101 and the vehicle module 102 to connect the isolation monitoring circuit with the Y-capacitor. When the Y-capacitor is to be discharged, both the corresponding switch and the corresponding main relay are closed, and when the Y-capacitor is not to be discharged, at least one of the corresponding switch and the corresponding main relay is opened.

The method 500 may be performed by at least one of the battery module 101 and the vehicle module 102. For example, at least one of the battery module 101 and the vehicle module 102 may include a processor (or a processor circuit) configured to detect an abnormal situation, determine whether an energy content of the Y-capacitor module is greater than a predetermined threshold in response to the abnormal situation and discharge the Y-capacitor module using the isolation monitoring circuit of the battery module 101 in response to the energy content of the Y-capacitor module being greater than the predetermined threshold.

Although the foregoing embodiments have been described to practice some examples of a battery system and an electric vehicle including the battery system, the disclosed embodiments are set forth for illustrative purposes and do not serve to limit the invention. Those skilled in the art will readily appreciate that many modifications and variations can be made, without departing from the spirit and scope of the invention as defined in the appended claims, and such modifications and variations are encompassed within the scope and spirit of the present invention.

What is claimed is:

1. A battery system for use with an electric vehicle including a Y-capacitor module, the battery system comprising:
   a power source; and
   an isolation monitoring circuit electrically connected with the power source,
   wherein the isolation monitoring circuit is configured to discharge the Y-capacitor module when an abnormal situation occurs in the electric vehicle comprising the battery system and an energy content of the Y-capacitor module is greater than a predetermined threshold, and
   wherein the Y-capacitor module includes a first Y-capacitor arranged between a first HV pole (HV+) of the electric vehicle and a chassis of the electric vehicle and a second Y-capacitor arranged between a second HV pole (HV−) of the electric vehicle and the chassis.

2. The battery system according to claim 1, wherein the isolation monitoring circuit is configured to be connected in parallel with the Y-capacitor module when the battery system is electrically connected with the electric vehicle.

3. The battery system according to claim 1, wherein the isolation monitoring circuit comprises one or more circuit units each of which corresponds to a Y-capacitor of the Y-capacitor module.

4. The battery system according to claim 3, wherein each of the one or more circuit units comprises a switch and a resistor connected in series with each other, and wherein the resistor is configured to discharge the Y-capacitor within a required time.

5. The battery system according to claim 4, wherein each of the one or more circuit units further comprises a main relay connected in series with the switch and the resistor configured to separate the power source from the electric vehicle.

6. The battery system according to claim 3, wherein the power source includes a positive terminal and a negative terminal, wherein first and second circuit units corresponding to the first and second Y-capacitors are arranged in the isolation monitoring circuit, wherein the first circuit unit comprises a first resistor and a first switch connected between the positive terminal of the power source and a chassis, wherein the second circuit unit comprises a second resistor and a second switch connected between the negative terminal of the power source and the chassis, and wherein the first and second circuit units are configured to be connected in parallel with the first Y-capacitor and the second Y-capacitor of the Y-capacitor module respectively so as to discharge the first Y-capacitor and the second Y-capacitor respectively.

7. The battery system according to claim 6, wherein the first circuit unit further comprises a first main relay (Main+) connected in series with the first resistor and the first switch, wherein the second circuit unit further comprises a second main relay (Main−) connected in series with the second resistor and the second switch, and wherein the power source is connected between the first main relay (Main+) and the second main relay (Main−).

8. A system comprising:
   a battery module configured to be coupled with a vehicle module,
   wherein the vehicle module comprises a Y-capacitor module comprising a first Y-capacitor and a second Y-capacitor,
   wherein the battery module comprises a power source and an isolation monitoring circuit electrically connected with the power source,
   wherein the isolation monitoring circuit is configured to discharge the Y-capacitor module when an abnormal situation occurs in the system and an energy content of the Y-capacitor module is greater than a predetermined threshold, and
   wherein the first Y-capacitor is arranged between a first HV pole (HV+) of the vehicle module and a chassis of the vehicle module and the second Y-capacitor is arranged between a second HV pole (HV−) of the vehicle module and the chassis.

9. The system according to claim 8, wherein the vehicle module further comprises a load, and wherein the Y-capacitor module and the load are connected in parallel between the first HV pole (HV+) and the second HV pole (HV−).

10. The system according to claim 9, wherein the isolation monitoring circuit is configured to be connected in parallel with the Y-capacitor module when the battery module is electrically connected with the vehicle module.

11. The system according to claim 9, wherein the vehicle module further comprises an X-capacitor and the load connected between the first and second HV poles (HV+ and HV−), and a discharge circuit unit connected in parallel with and configured to discharge the X-capacitor, and wherein the X-capacitor comprises a switch and a resistor connected in series with each other.

12. The system according to claim 9, wherein the chassis is either of the vehicle module or the battery module, or both of the vehicle module and the battery module.

13. A method, comprising:
receiving a crash signal in response to an abnormal situation occurring in a system including a battery module and a vehicle module connected to each other, the battery module including an isolation monitoring circuit electrically connected with a power source, the vehicle module including a Y-capacitor;
determining whether an energy content of the Y-capacitor of the vehicle module is greater than a predetermined threshold in response to the crash signal; and
using the isolation monitoring circuit of the battery module as a discharge device to discharge the Y-capacitor of the vehicle module in response to the energy content of the Y-capacitor being greater than the predetermined threshold,
wherein the Y-capacitor is arranged between one of first and second HV poles (HV+ and HV−) of the vehicle module and a chassis of the vehicle module.

14. The method according to claim 13, wherein the threshold is 0.2J, and the using comprises controlling a relay between the battery module and the vehicle module to connect the isolation monitoring circuit with the Y-capacitor, wherein in response to the Y-capacitor being discharged, both the corresponding switch and a corresponding main relay are configured to be closed, and wherein in response to the Y-capacitor not being discharged, at least one of the corresponding switch and the corresponding main relay is configured to be opened.

15. An electric vehicle configured to be electrically connected with a battery module, the electric vehicle comprising:
a load;
a Y-capacitor module electrically connected to the load; and
a processor circuit configured to detect an abnormal situation in the electric vehicle, determine whether an energy content of the Y-capacitor module is greater than a predetermined threshold in response to the abnormal situation and discharge the Y-capacitor module using an isolation monitoring circuit of the battery module in response to the energy content of the Y-capacitor module being greater than the predetermined threshold,
wherein the Y-capacitor module includes a first Y-capacitor arranged between a first HV pole (HV+) of the electric vehicle and a chassis of the electric vehicle and a second Y-capacitor arranged between a second HV pole (HV−) of the electric vehicle and the chassis.

16. The electric vehicle according to claim 15, wherein the Y-capacitor module is configured to be connected in parallel with the isolation monitoring circuit when the battery module is electrically connected with the electric vehicle.

17. The electric vehicle according to claim 15, further comprising an X-capacitor and a discharge circuit connected in parallel with and configured to discharge the X-capacitor, wherein the X-capacitor comprises a switch and a resistor connected in series with each other.

* * * * *